United States Patent
Bangert et al.

(10) Patent No.: US 7,355,439 B2
(45) Date of Patent: Apr. 8, 2008

(54) CONFIGURABLE LOGIC CIRCUIT ARRANGEMENT

(75) Inventors: Joachim Bangert, Erlangen (DE); Christian Siemers, Wolfsburg (DE)

(73) Assignee: SIEMENS Aktiengesellschaft, Munich (DE)

( * ) Notice: Subject to any disclaimer, the term of this patent is extended or adjusted under 35 U.S.C. 154(b) by 11 days.

(21) Appl. No.: 10/571,790

(22) PCT Filed: Oct. 7, 2004

(86) PCT No.: PCT/EP2004/011220

§ 371 (c)(1), (2), (4) Date: Mar. 15, 2006

(87) PCT Pub. No.: WO2005/036750

PCT Pub. Date: Apr. 21, 2005

(65) Prior Publication Data
US 2007/0024319 A1 Feb. 1, 2007

(30) Foreign Application Priority Data
Oct. 8, 2003 (DE) ................ 103 46 679

(51) Int. Cl.
*H03K 19/173* (2006.01)
*G06F 7/38* (2006.01)
(52) U.S. Cl. ............... 326/38; 326/39; 326/41
(58) Field of Classification Search .......... 326/39–41
See application file for complete search history.

(56) References Cited

U.S. PATENT DOCUMENTS

| 6,097,212 | A | 8/2000 | Agrawal et al. |
| 6,292,019 | B1 | 9/2001 | New et al. |
| 6,556,042 | B1 | 4/2003 | Kaviani |
| 6,888,371 | B2 * | 5/2005 | Wong ................ 326/38 |
| 6,924,663 | B2 * | 8/2005 | Masui et al. ........... 326/38 |

FOREIGN PATENT DOCUMENTS

| EP | 0 785 630 | 7/1997 |
| WO | WO 00/36749 | 6/2000 |
| WO | WO 03/038644 | 5/2003 |
| WO | WO 03/039001 | 5/2003 |
| WO | WO 03/079550 | 9/2003 |

OTHER PUBLICATIONS

Fujii T et al: "A dynamically reconfigurable logic engine with a multi-context/multi-mode unified-cell architecture" Solid-State Circuits Conference, 1999. Digest of Technical Papers, ISSCC. 1999 IEEE International San Francisco, CA, USA Feb. 15-17, 1999, Piscataway, NJ, USA, IEEE, US, Feb. 15, 1999, Seiten 364-365, XP010329783 ISBN: 0-7803-5126-6 . . . .

* cited by examiner

*Primary Examiner*—Anh Q. Tran
(74) *Attorney, Agent, or Firm*—Young & Thompson

(57) ABSTRACT

A configurable logic circuit arrangement includes at least one multiplexer for switching logic signals. The multiplexer includes one or more data inputs and one or more control signal inputs. The at least one multiplexer (8, 12, 13) can be configured by one or more external control signal transmitter elements of the circuit arrangement during the operation of the circuit in a run-time variable manner by configuration signals that are applied to the control inputs and forwards the logical signals that are applied to the data inputs during operation of the circuit in a run-time variable manner.

13 Claims, 2 Drawing Sheets

CONFIGURABLE LOGIC CIRCUIT ARRANGEMENT

BACKGROUND OF THE INVENTION

1. Field of the Invention

The invention relates to a configurable logic circuit arrangement comprising at least one multiplexer for switching logic signals, said multiplexer comprising one or more data inputs and one or more control signal inputs.

2. Description of the Related Art

A multiplexer enables the selection of one of n data lines by means of log to the base 2 of (n)+1 control lines. This is connected to the output of the MUX and it forwards the logic signals in this way. Programmable logic devices (PLD) acquire their flexibility through the configurability of the data processing (logic block) and the wiring (paths). In a typical PLD, the area proportion of the paths is approximately 75% and that of the logic elements is about 25%.

Path multiplexers (or router mux), that is to say multiplexers in which active signal paths with propagation-time-variant signal values are connected, are widespread in programmable logic devices. Multiplexers which are also referred to as data selectors serve for changing over from one of a plurality of inputs to an output. Multiplexer structures of this type are used in programmable logic devices for routing the signals. Here a data input is selected before operation of the circuit, which data input carries signal values that change during operation, while the selection of the data input, that is to say of the signal value source, remains constant.

Multiplexers are thus the crucial components in the case of the configurable wiring. In the simplest case, a binary-value input of a multiplexer controls the assignment of at least two data inputs to an output.

It is known to configure paths having multiplexers in a configuration or programming operation by means of configuration signals. This operation has to take place before operation of the circuit. With this type of multiplexer, also referred to as router mux, a nonvolatile configuration of the control inputs is performed, for example by means of a mask, a fuse, a flash cell or a transistor configured in nonvolatile fashion, so that during normal operation, that is to say during the propagation time of the data signals, the multiplexer cannot be changed. Devices also exist whose configuration is based on the storage of the items of information in volatile SRAM cells. Operating means for propagation time configuration are not provided, however. Although structures of this type have proved worthwhile overall, it is regarded as a disadvantage that very many lines are needed for the configuration of the control inputs and a configurable multiplexer correspondingly requires a considerable peripheral area. The case may even arise wherein the circuit outlay for the configuration is higher than the outlay for the logic processing in the logic block. A further disadvantage can be seen in the fact that the lines required for the configuration and their logic devices are subsequently, that is to say after the configuration, no longer available for some other utilization in the course of operation (normal operation).

A very large portion of the configuration lines and of the associated logic elements possibly remain unutilized in conventional logic circuit arrangements.

The following multiplexer structures occur in logic blocks: logic mux, switch mux, LUT mux. Parameters that distinguish these MUX are: configuration operation; number of memory cells; what remains configurable. It follows from this that either the storage of the data and configurations are absent or, in the course of operation, a reconfiguration or change of the signals is not possible and the assigned periphery cannot be utilized any further.

SUMMARY OF THE INVENTION

Therefore, the invention is based on the problem of providing a configurable logic circuit arrangement which eliminates the disadvantages mentioned and can be used more flexibly.

In order to solve this problem, in the case of a configurable logic circuit arrangement of the type mentioned in the introduction, it is provided according to the invention that the at least one multiplexer can be configured by means of one or more external control signal transmitter elements of the circuit arrangement in a propagation-time-variant manner during the operation of the circuit by means of configuration signals that can be applied to the control inputs and forwards logic signals that can be applied to the data inputs in a propagation-time-variant manner during the operation of the circuit, it being possible to perform a propagation-time-variant configuration of at least one memory cell.

The possibility for storing the configuration signals is maintained in this case.

In this case, external control signal elements shall be understood such that a signal from the respective element/device or by feeding into the respective element performs the control, that is to say that this signal or its generation lies outside the circuit arrangement.

The invention is based on the insight of utilizing the infra-structure required for the configuration not only initially during the configuration operation but also during the propagation time of the signals in normal operation. Accordingly, the logic circuit arrangement according to the invention has to be configured very often and very rapidly. The infrastructure required for the configuration is not left unused, but rather continues to be utilized for the configuration as required during operation.

A particularly important advantage of the invention can be seen in the fact that in the case of path multiplexers, in particular, the outlay for selecting a data line in the course of operation is greatly reduced. It is possible to select a data line during normal operation without logic blocks and the outlay for this n:1 selection is minimal. In this case, outlay is to be understood to mean the product of silicon area (including the resources remaining unutilized e.g. in the routing), delay time and power loss or a quantity proportional to these three parameters. While the delay time remains approximately constant, the parameters of silicon area and power loss are significantly reduced in the case of the embodiment according to the invention since the selection of the data line is performed dynamically by the multiplexer or multiplexers in the data bus. By contrast, this selection has to be performed by additional logic blocks in the case of known logic circuit arrangements.

Essentially the same holds true for logic mux as for the path multiplexers. The gain is afforded here by savings in the network which configures the logic mux memory cells.

For LUT mux, a flexibility enhancement is achieved by virtue of logic blocks being configured as registers whose contents can be changed in a variant manner. The register outputs are passed to a logic block (possibly a plurality) connected as MUX. The gain is afforded here by savings in the network which configures the LUT mux memory cells, and the saving of logic blocks.

For switch mux, a flexibility enhancement of the inputs is not made possible since these are already maximally enhanced with respect to flexibility. The outlay for buffering the output and/or the input is obviated, however.

The configuration of the logic circuit arrangement according to the invention thus achieves the advantage, in particular, that existing multiplexers need not be enlarged and a propagation-time-variant configuration be achieved thereby, rather a flexibility enhancement of the multiplexer function is achieved by a reconfiguration with respect to the propagation time. The consequence of this is that either the same task can be achieved by fewer components/transistors or more tasks, that is to say a higher flexibility, can be achieved with the same number of elements/transistors. What is essential in this case is that this can be achieved by a propagation-time-variant (re)configuration of the at least one memory cell (for the configuration required).

It is particularly advantageous if, in the case of the logic circuit arrangement according to the invention, the or each input of the multiplexer is connected to a nonvolatile memory cell which can change in nanoseconds in the course of operation. It is not necessary for all the control inputs to be connected to a nonvolatile memory cell since configurations in which the configuration is only partially stored are also possible. In general, however, it will be expedient for a memory cell to be assigned to each input.

It is particularly expedient for the memory cell assigned to an input to be configurable by means of dynamic, and that is to say propagation-time-variable, signals which originate from the device. The space requirement of the entire logic circuit arrangement can thereby be considerably reduced, and, moreover, each memory cell can be reconfigured dynamically, that is to say that it can be reprogrammed during operation. The data and also the stored configurations are retained in the memory cell. A new configuration is possible in each clock cycle, however; the configurability remains variant. This affords the advantage that the number of logic circuit arrangements on a chip can decrease.

Memory cells using magnetoresistive technology, which is also referred to as XMR technology, are particularly suitable for the configurable logic circuit arrangement according to the invention. As an alternative, memory cells using OUM technology (ovonic unified memory) or FRAM (ferroelectric random access memory) are also taken into consideration.

An even higher flexibility can be obtained if the external control signal transmitter element is another multiplexer. Different multiplexers can be connected in a cascaded manner in this way. With a construction of this type, logic combinations can already be realized in the routing region.

The configurable logic circuit arrangement according to the invention may be connected to further logic circuit arrangements in a cascade-like manner. In this way, all of the data and control inputs can be selected by multiplexers connected upstream from available signals on the data bus or configuration bus, so that cascades of multiplexers with a known propagation time exist. In the prior art, the configuration bus is used as a configuration possibility for routing and the logic blocks. The signals are routed through a cascade of multiplexers to the corresponding pins of the chips. The configuration bus together with the cascade is left unused in the course of operation. The configuration bus of the subject matter of the invention partly comprises the architecture as in the prior art, particularly if the alternative according to the invention is not technically practical. Moreover, the configuration bus is enhanced in terms of flexibility and connected to the data bus, thereby enabling the controlled changeover.

It is particularly preferred for the configurable logic circuit device according to the invention to be part of a field programmable gate array (FPGA) or a complex programmable logic device (CPLD).

BRIEF DESCRIPTION OF THE DRAWING FIGURES

Further advantages and details of the invention are explained on the basis of an exemplary embodiment with reference to the figures. The figures are schematic illustrations and show:

DETAILED DESCRIPTION OF THE PREFERRED EMBODIMENTS

Figure 1:
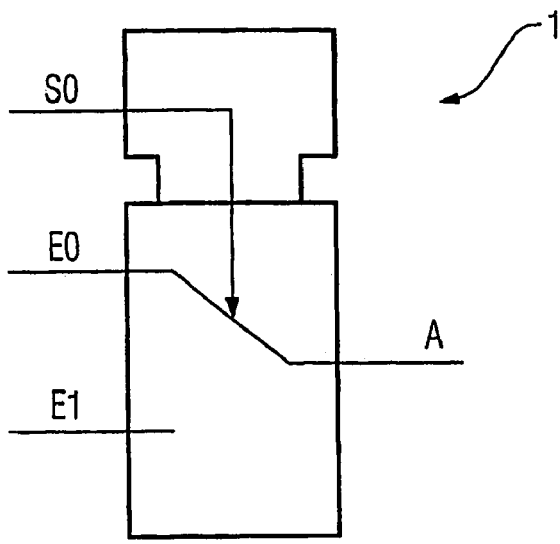
FIG. 1 illustrates a conventional 2:1 multiplexer without a configuration possibility.

FIG. 1 shows a conventional 2:1 multiplexer having a binary-value control input S0 and two data inputs E0 and E1 (switching symbol). A respective one of the data inputs E0 or E1 is connected to the output A, the assignment of the data inputs E0 and E1 to the output A being controlled via the control input S0. If the signal "0" is present at the control input S0, E0 is connected to A. If the signal "1" is present at the control input S0, E1 is connected to A. The multiplexer 1 generally serves for changing over from one of a plurality of inputs to an output. Multiplexers of this type are known and therefore do not require more extensive explanation.

Figure 2:
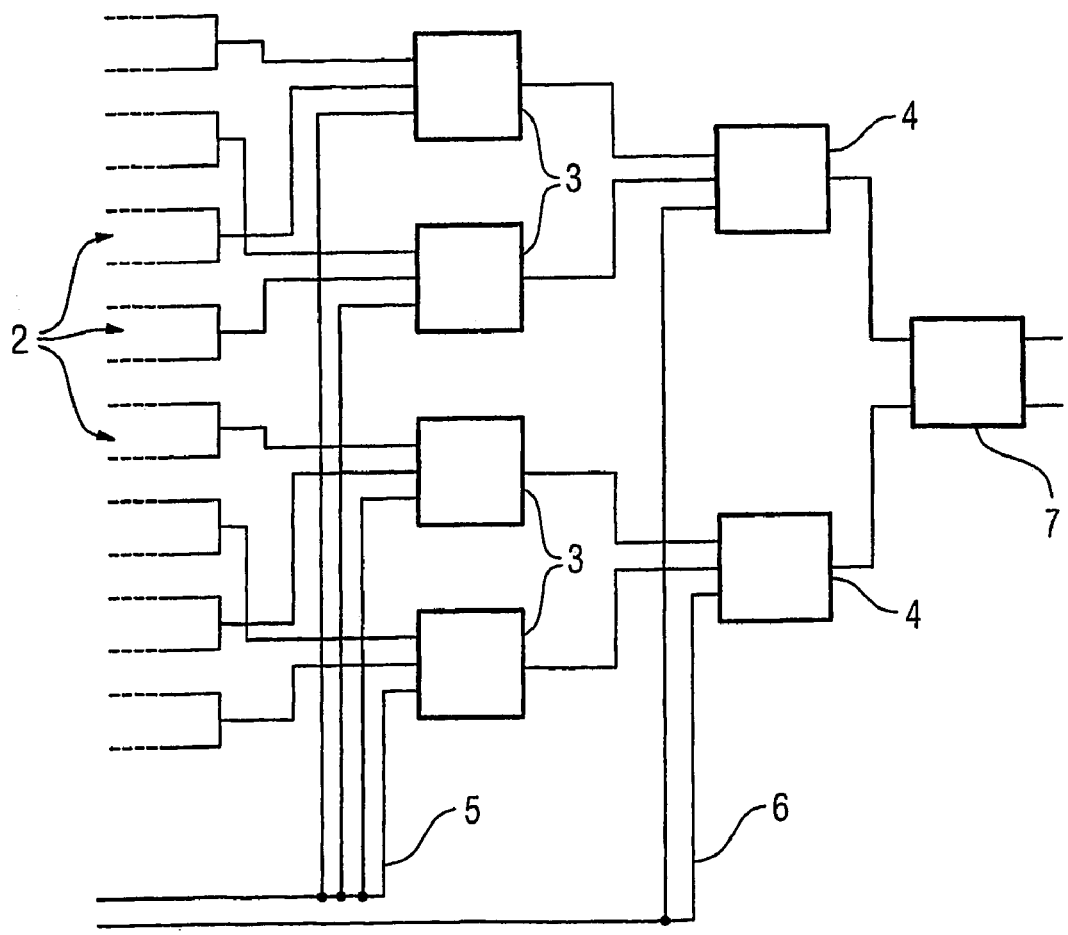
FIG. 2 illustrates a conventional field programmable gate array with a plurality of logic blocks connected as multiplexers as selection region.

FIG. 2 shows an exemplary embodiment of a conventional field programmable gate array (FPGA) having a plurality of logic blocks connected as multiplexers as selection region. Intermediate results arise in this circuit and are available on the data bus 2. Two of said intermediate results are intended to be selected and processed. The intermediate results which are selected are decided on during the propagation time. The selection region of the circuit shown in FIG. 2 comprises four logic blocks which are connected as multiplexers 3 and are connected in parallel and the outputs of which are connected to the inputs of logic blocks 4 connected as multiplexers. The logic blocks connected as multiplexers 3 are in each case connected to selection lines 5. The selection lines 5 are used to stipulate whether a multiplexer 3 forwards the signal of the input E0 or of the input E1. It is only because the selection lines 5 can be influenced dynamically that the data which are processed can be decided on during the propagation time.

The logic blocks connected as multiplexer 4 analogously have selection lines 6 connected to the control inputs. The two selected signals pass from the multiplexers 4 to an execution block 7. Here, too, a selection can take place during the propagation time only by means of correspondingly connected logic blocks. After the processing in the execution block 7, the result is again passed onto the data bus and can be processed further.

The construction shown in FIG. 2 is favorable for small logic blocks and a complex processing, that is to say processing comprising many logic blocks. The logic blocks used for selection serve as multiplexers since they select from the data bus in each case one input signal from two possible input signals with the aid of a control line. The use of multiplexers in routing is ruled out here since, although these multiplexers are very numerous, they only operate in a propagation-time-static manner. A dynamic changeover of the source is not possible. The large number of required logic blocks 3, 4 which are connected as multiplexers is therefore to be regarded as disadvantageous.

For large, high-performance logic blocks, it may be more favorable to expend the fewest possible logic blocks for a router region and instead to define a plurality of processing blocks whose outputs can then be selected by means of the control lines.

Figure 3:
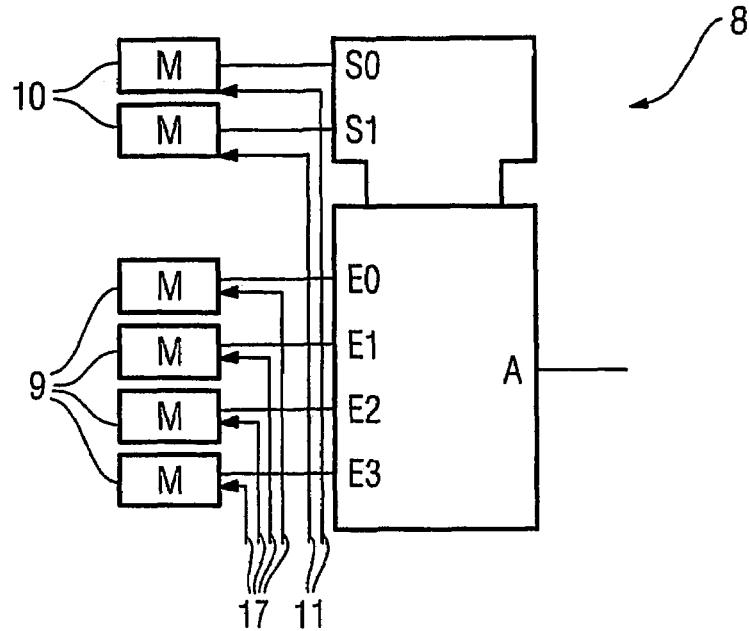
FIG. 3 illustrates a configurable logic circuit arrangement according to the invention.

FIG. 3 shows a configurable logic circuit arrangement according to the invention in the form of a multiplexer 8. In terms of its basic construction, the multiplexer 8 corresponds to the multiplexer illustrated in FIG. 1, apart from the fact that the multiplexer 8 has four inputs (E0, E1, E2, E3) which are each connected to a nonvolatile memory cell 9. The control inputs S0 and S1 of the multiplexer 8 are each connected to memory cells 10. The memory cells 9, 10 are formed as XMR cells, that is to say that magnetoresistive memories are involved. However, alternative embodiments are also conceivable in which memory cells using OUM logic (ovonic unified memory, FRAM) or using GMR or TMR technology are employed. The memory cells 9, 10 are in each case connected to external control signal transmitter elements via selection lines 11, 17 of the configuration bus, so that they can be configured in a propagation-time-variant manner. The external control signal transmitter element is another multiplexer. In a departure from the exemplary embodiment illustrated, it is additionally possible for some or all of the memory cells 9 to be connected to selection lines, so that, besides the memory cells 10 connected to the control inputs S0 and S1, the memory cells 9 connected to the data inputs E0 to E3 can also be reprogrammed during the propagation time.

The logic circuit arrangement having nonvolatile memories 9, 10 as illustrated in FIG. 3 is particularly distinguished by its high integration density since no additional circuit outlay is required in order to select a specific data line from the data bus. Accordingly, the space requirement and the number of logic elements required are comparatively small. It can be assumed that savings of up to ⅓ of the logic elements can be obtained in comparison with conventional circuits.

Figure 4:
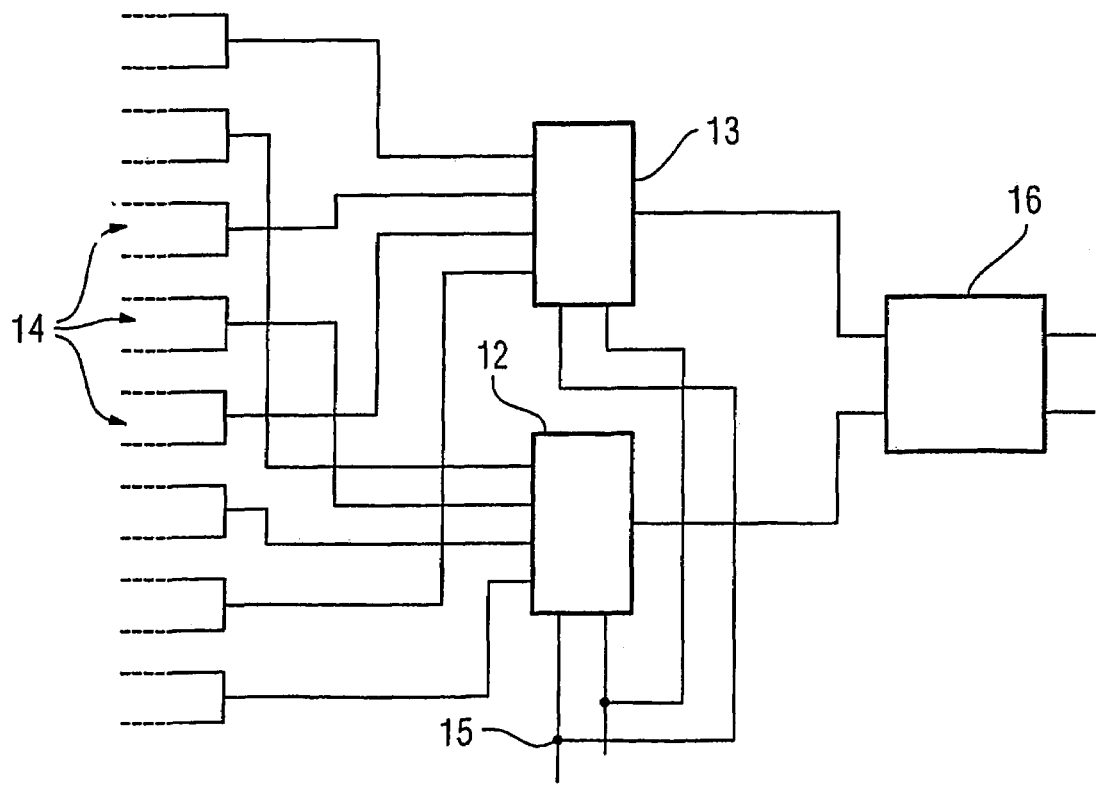
FIG. 4 illustrates a further configurable logic circuit arrangement according to the invention.

FIG. 4 shows an exemplary embodiment of the logic circuit arrangement according to the invention. This circuit comprises two multiplexers 12, 13 which, analogously to the circuit shown in FIG. 2, obtain intermediate results which are available on the data bus 14. The multiplexers 12, 13 are connected to the configuration bus via lines 15. In contrast to the circuit shown in FIG. 2, the selection of the intermediate results required is performed in the routing region, that is to say that this function is performed directly by the multiplexers 12, 13 present, which are parts of the data bus system, so that the circuit outlay for the selection of the data lines is obviated. In the case of the known circuit in accordance with the circuit illustrated in FIG. 2, this function is performed by additional logic blocks (multiplexers 3, 4) in the selection region. The results pass from the multiplexers 12, 13 to an execution block 16, which outputs the result of the logic combination to the data bus again.

The utilization of the multiplexers formed according to the invention in routing makes it unnecessary, therefore, to utilize the logic blocks as dynamic path multiplexers. Since the multiplexers are already present in routing and are only extended in terms of their usability or flexibility, this consequently results in the area gain discussed and, coupled with this, the reduction of the power loss.

The invention claimed is:

1. A configurable logic circuit arrangement, comprising: at least one multiplexer for switching logic signals, said multiplexer comprising one or more data inputs and one or more control signal inputs, wherein the at least one multiplexer (8, 12, 13) can be configured by means of one or more external control signal transmitter elements of the circuit arrangement in a propagation-time-variant manner during the operation of the circuit by means of configuration signals that can be applied to the control inputs and forwards logic signals that can be applied to the data inputs in a propagation-time-variant manner during the operation of the circuit, it being possible to perform a propagation-time-variant configuration of at least one memory cell (9) connected in series to the control signal input of the multiplexer (8), and the external control signal transmitter element is an output of another multiplexer.

2. The configurable logic circuit arrangement as claimed in claim 1, wherein at least one input of the multiplexer (8) is connected to a nonvolatile memory cell 910).

3. The configurable logic circuit arrangement as claimed in claim 2, wherein at least one data input of the multiplexer (8) is connected to a nonvolatile memory cell (9).

4. The configurable logic circuit arrangement as claimed in claim 2, wherein the at least one memory cell (9, 10) can be altered by means of dynamic, propagation-time-variable signals originating from the circuit arrangement.

5. The configurable logic circuit arrangement as claimed in claim 2, wherein the at least one memory cell (9, 10) is a magnetoresistive memory using XMR technology or FRAM technology (ferroelectric RAM).

6. The configurable logic circuit arrangement as claimed in claim 2, wherein the memory cell (9, 10) is a memory using OUM technology (ovonic unified memory) or FRAM technology (ferroelectric RAM).

7. The configurable logic circuit arrangement as claimed in claim 1, wherein it can be connected or is connected to further logic circuit arrangements in a cascade-like manner.

8. The configurable logic circuit arrangement as claimed in claim 1, wherein it is part of a field programmable gate array (FPGA) or a complex programmable logic device (CPLD).

9. The configurable logic circuit arrangement as claimed in claim 3, wherein the at least one memory cell (9, 10) can be altered by means of dynamic, propagation-time-variable signals originating from the circuit arrangement.

10. The configurable logic circuit arrangement as claimed in claim 3, wherein the at least one memory cell (9, 10) is a magnetoresistive memory using XMR technology or FRAN technology (ferroelectric RAM).

11. The configurable logic circuit arrangement as claimed in claim 4, wherein the at least one memory cell (9, 10) is a magnetoresistive memory using XMR technology or FRAN technology (ferroelectric RAM).

12. The configurable logic circuit arrangement as claimed in claim 3, wherein the memory cell (9, 10) is a memory using OUM technology (ovonic unified memory) or PRAM technology (ferroelectric RAM).

13. The configurable logic circuit arrangement as claimed in claim 4, wherein the memory cell (9, 10) is a memory using OUM technology (ovonic unified memory) or PRAM technology (ferroelectric RAM).

* * * * *